United States Patent [19]

Saiki et al.

[11] 4,040,083
[45] Aug. 2, 1977

[54] ALUMINUM OXIDE LAYER BONDING POLYMER RESIN LAYER TO SEMICONDUCTOR DEVICE

[75] Inventors: Atsushi Saiki, Musashimurayama; Seiki Harada; Yoichi Oba, both of Hachioji, all of Japan

[73] Assignee: Hitachi, Ltd., Japan

[21] Appl. No.: 526,407

[22] Filed: Nov. 22, 1974

[30] Foreign Application Priority Data

Apr. 15, 1974 Japan .................. 49-41011

[51] Int. Cl.$^2$ ............... H01L 23/30; H01L 23/50
[52] U.S. Cl. .................. 357/54; 357/72; 427/82
[58] Field of Search ............ 357/72, 54, 52; 174/52 PE; 260/78 TF, 47 CP; 427/407 A, 82

[56] References Cited

U.S. PATENT DOCUMENTS 3,013,901  12/1961  Bugosh .................. 117/72
3,367,025  2/1968   Doyle ................... 357/72
3,767,463  10/1973  Aboaf et al. ............ 357/54
3,801,880  4/1974   Harada et al. .......... 357/54

FOREIGN PATENT DOCUMENTS 4,962,081  6/1974   Japan .................. 357/54

Primary Examiner—William D. Larkins
Attorney, Agent, or Firm—Craig & Antonelli

[57] ABSTRACT

Disclosed is a semiconductor device including a Si body, and $SiO_2$ layer disposed on the surface of the body, an aluminum oxide layer having a thickness of about 50 A on the $SiO_2$ layer, which is formed by applying a solution including an aluminum chelate compound onto the $SiO_2$ layer and heating the solution at a temperature of 300° C. for 30 minutes, and a polymer resin layer of polyimide disposed on the aluminum oxide layer. In this device, the adhesive-strength between the $SiO_2$ layer and the polyimide layer is remarkably increased when compared with a semiconductor device wherein the polyimide layer is directly disposed on the $SiO_2$ layer.

44 Claims, 20 Drawing Figures

ALUMINUM OXIDE LAYER BONDING POLYMER RESIN LAYER TO SEMICONDUCTOR DEVICE

This invention relates to semiconductor devices, such as a semiconductor device wherein a resin film is disposed on a surface of a semiconductor body, and a semiconductor device having multilevel interconnections, between which resin films are disposed, and a method for making such devices.

In conventional semiconductor devices, an insulating film, such as $SiO_2$ film or $Si_3N_4$ film, is provided on a surface of a semiconductor body wherein at least one semiconductor element is disposed, for passivating the surface of the semiconductor device.

Since it is very difficult to obtain thick $SiO_2$ film or $Si_3N_4$ film because of formation of cracks, there are large capacities between interconnections disposed on said insulating film and connected partly to at least one semiconductor element, and the semiconductor body, or between interconnections on said insulating film and the body, and hence not only the characteristic of the semiconductor device degrades, but also it becomes very complicated to design the semiconductor device having desired characteristics.

These defects are increased in a semiconductor device having multilevel interconnections, since it has several interconnections for supplying electric power to semiconductor elements and for supplying outputs to other elements or to output terminals.

To reduce said defects, it has been proposed to dispose a resin film, especially a polyimide resin film, on the insulating film in U.S. Pat. No. 3,700,497, and also to dispose another kind of polyimide resin (hereinafter it is referred to as PIQ) film having a general formula of:

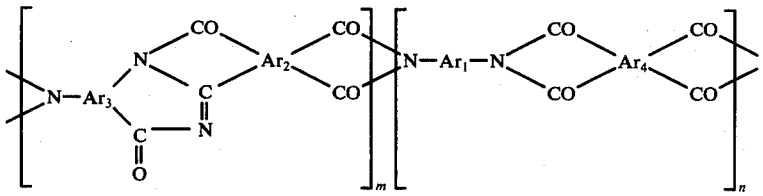

wherein $Ar_1$, $Ar_2$, $Ar_3$ and $Ar_4$ are selected from aromatic groups, on the insulating film in U.S. Ser. No. 407,447 now abandoned, assigned to the same assignee as this application. The semiconductor device having said PIQ film on the insulating film has better electrical characteristics than those in the semiconductor device in U.S. Pat. No. 3,700,497.

These semiconductor devices, however, still have a defect in the adhesiveness between the resin film and the insulating film. That is, the adhesiveness between the resin film and the insulating film is weak, and hence the life of the semiconductor devices becomes short; especially when they are utilized in a moist atmosphere, the life becomes extremely short.

For improving the adhesiveness between the resin film and the insulating film, the present inventors have made experiments wherein a layer of organic compound including alkoxysilane radicals and amide radicals was disposed between the resin film and the insulating film referring to "Chemistry and Technology of Silicones", pp. 582-584, by Walter Noll, published by ACADEMIC PRESS, New York and London in 1968. By these experiments, it has been confirmed that the adhesiveness between the resin film and the insulating film has been increased by providing the organic compound therebetween. The adhesiveness between the resin film and the insulating film with organic compound layer therebetween, however, does not have enough reliability, since the adhesive-strength is still small.

The object of the present invention, therefore, is to provide a semiconductor device having a strongly adhered resin film to an insulating film on a semiconductor body.

Another object of the present invention is to provide a semiconductor device having a strongly adhered resin film to an insulating film or other resin film provided between multilevel interconnections.

A further object of the present invention is to provide a method for fabricating a semiconductor device having a strongly adhered resin film to an insulating film on a semiconductor body.

A still further object of the present invention is to provide a method for fabricating a semiconductor device having multilevel interconnections on a semiconductor body through an insulating film wherein a resin film strongly adhered to the insulating film or to other resin film is provided between said interconnections.

The above objects are attained by providing a layer of a substance of a metal oxide, such as aluminum oxide, titanium oxide, molybdenum oxide, chromium oxide or nickel oxide between a polymer resin layer and an insulating layer, and between polymer resin layers. Especially aluminum oxide is suitable for a substance of an intermediate layer between the polymer resin layer and the insulating layer or the polymer resin layers, when the polymer resin layer is a substance comprised of polyimide, PIQ or polybenzimidazole.

The additional objects and advantages of the present invention will become apparent from the following description when taken in conjunction with the accompanying drawing, wherein.

Before the detailed description of the present invention, the PIQ resin will be described.

The PIQ resin is a copolymer including therein groups of the general formulae:

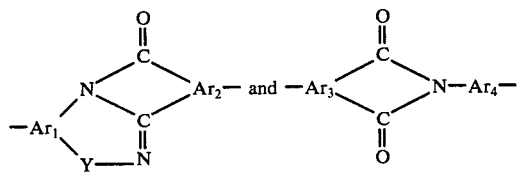

wherein $Ar_1$, $Ar_2$, $Ar_3$, and $Ar_4$ represent one of aromatic groups and Y represents $SO_2$ or CO.

This PIQ resin can be formed by the steps of reacting a diaminoamide compound shown by a general formula:

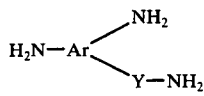

wherein Ar represents residual radicals of aromatic groups, Y represents $SO_2$ or CO, and one of the amino groups and Y — $NH_2$ group are in an ortho position each other, with a diamine and a tetracarboxylic acid dianhydride, thereby forming a polyamide-type intermediate product, and causing said intermediate product to dehydrate and to close rings.

In more detail, the PIQ resin is described in Japanese Pat. No. 702,696 (Japanese Patent Publication No. 48-2956 (1973)).

The present invention is explained in detail hereinafter by referring to the Figures.

Figure 1:
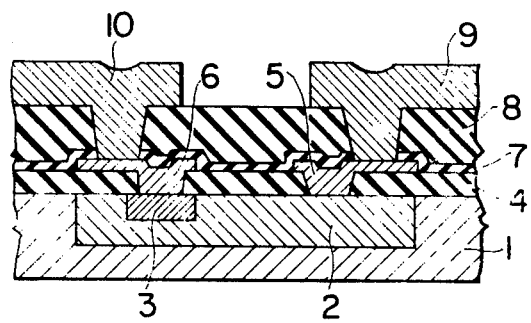
FIG. 1 is a longitudinal sectional view of one embodiment of the present invention.

Shown in FIG. 1 is a section of a planar type semiconductor device which is one embodiment of the present invention.

In FIG. 1, reference numeral 1 designates an n-type Si body which acts as a collector of the semiconductor device, that is a transistor, in which a first semiconductor region 2 of p-type is disposed, which acts as base of the transistor. In the first semiconductor region 2, a second semiconductor region 3 of n-type is disposed, which acts as an emitter of the transistor and on the surface of the Si body 1, an $SiO_2$ layer 4 is disposed. Reference numeral 5 is a first metal layer which penetrates the $SiO_2$ layer 4 to contact with the first semiconductor region 2 and which extends to a part of the surface of the $SiO_2$ layer 4. Reference numeral 6 is a second metal layer which penetrates the $SiO_s$ layer 4 to contact with the second semiconductor region 3 and which extends to another part of the surface of the $SiO_2$ layer 4 than the part at which the first metal layer 5 is disposed. On other part of the surface of the $SiO_2$ layer 4 than the parts at which the first and second metal layers 5 and 6 are disposed, and on the surfaces of the first and second metal layers 5 and 6, an aluminum oxide layer 7 is disposed, and on the aluminum oxide layer 7, polymer resin layer 8 is disposed. Reference numeral 9 designates a third metal layer penetrating the polymer resin layer 8 and the aluminum oxide layer 7 to contact with the first metal layer 5, and a base electrode consists of the first and third metal layers 5 and 9. Reference numeral 10 designates a fourth metal layer penetrating the polymer resin layer 8 and the aluminum oxide layer 7 to contact with the second metal layer 6, and an emitter electrode consists of the second and fourth layers 6 and 10.

Figure 2A:
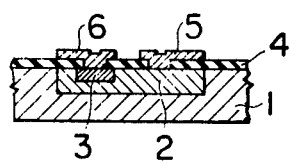
FIGS. 2a through 2e show in longitudinal section, explanatory views of the intermediate products obtained in the process for making the embodiment shown in FIG. 1.
Figure 2D:
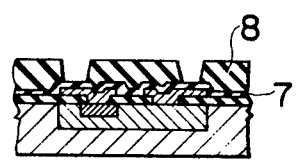
Figure 2B:
Figure 2E:
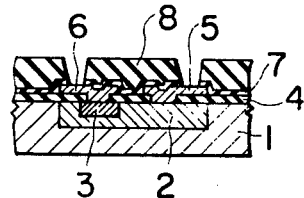
Figure 2C:
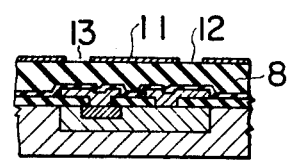

The semiconductor device is fabricated by preparing the Si body 1 of n-type, diffusing boron into the body 1 for forming the first semiconductor region 2, which acts as the base, diffusing phosphorous into the first semiconductor region 2 for forming the second semiconductor region 3, which acts as the emitter, forming the $SiO_2$ layer 4 on the surface of the body 1, forming apertures in the $SiO_2$ layer 4 for exposing the surface of a part of the first semiconductor region 2 and a part of the second semiconductor region 3, forming the first metal layer 5 of aluminum and the second metal layer 6 of aluminum on the $SiO_2$ layer 4 so as to contact to the first and second semiconductor regions 2 and 3, respectively (FIG. 2a), forming the aluminum oxide layer 7 on the surfaces of the first and second metal layers 5 and 6 and of the $SiO_2$ layer 4 (FIG. 2b), forming the polymer resin layer 8 having a thickness of 5 $\mu$ on the surface of aluminum oxide layer 7, forming a chromium layer 11 having apertures 12 and 13 at corresponding parts to the first and second metal layers 5 and 6 (FIG. 2c), etching selectively the polymer resin layer 8 through the apertures 12 and 13 to expose selective portions of the aluminum oxide layer 7, removing the chromium layer 11 (FIG. 2d), etching exposed selective portions of the aluminum oxide layer 7 for exposing the surfaces of the first and second metal layers 5 and 6 (FIG. 2e), and forming the third metal layer 9 and the fourth metal layer 10 so that one part thereof is connected to each of the first and second metal layers 5 and 6 and other part thereof extends on the surface of the polymer resin layer 8.

In this example, the aluminum oxide layer is formed by a reaction between $AlCl_3$, $CO_2$ and $H_2$, and a thickness thereof is about 1000 A.

This aluminum oxide layer may be replaced by other metal oxide layers, such as layers of titanium oxide, molybdenum oxide, chromium oxide or nickel oxide.

The thickness of the metal oxide layer should be between 10 and 2000 A, preferably between 50 and 500 A, and more preferably between 50 and 200 A. When the thickness is less than 10 A, the metal oxide layer can not be uniformly exist on the surfaces of the $SiO_2$ layer 4 and the metal layers 5 and 6, and when the thickness is more than 2000 A, there are sometimes cracks in the metal oxide layer.

As a polymer resin for the polymer resin layer 8, any polymer resins, such as resins of copolymer of fluorinated ethylene/propylene, polyimide, PIQ, epoxy, phenol, polycarbonate, polyamide, and polybenzimidazole can be utilized. However, polyimide, PIQ and polybenzimidazole are more preferable for the present invention than other resins, since they are suitable for maintaining characteristics of semiconductor devices.

In the above embodiment, PIQ resin is utilized as the polymer resin layer 8, and the polymer resin layer 8 is formed as follows. A PIQ solution having the following composition is prepared:

| Nonvolatile contents: | |
| --- | --- |
| 4,4'-Diaminodiphenylether-3-Carbonamide | 5 mol % |
| 4,4'-Diaminodiphenylether | 45 mol % |
| Pyromellitic acid dianhydride | 25 mol % |
| 3,3',4,4'-Benzophenontetracarboxylic acid dianhydride | 25 mol % |
| Solvent contents: | |
| N-Methyl-2-Pyrrolidone | 50 wt. % |
| N,N-Dimethylacetoamide | 50 wt. % |
| Nonvolatile concentration | 20 wt. % |
| Viscosity of the Solution | about 300 centipoises |

The prepolymer solution of polyimide is applied onto the surface of the aluminum oxide layer 7 by a rotor running at about 5000 rpm, whereby a polymer resin layer having a thickness about 1 $\mu$ is formed. For forming the polymer resin layer having a desired thickness, the viscosity of the solution, the concentration of the nonvolatile contents, and/or the rotating speed of the rotor are controlled or the solution is applied on the formed polymer resin layer by means of lap applications. By means as described above, the thickness of the polymer resin layer is controlled so as to have from less than 1 $\mu$ to more than 10 $\mu$ at will. In this embodiment, the polymer resin layer having a thickness of 5 $\mu$ is formed.

To contact the third metal layer 9 with the first metal layer 2 and the metal layer 6, through holes are formed in the polymer resin layer 8 and the aluminum oxide layer 7. For forming through holes in the polymer resin layer 8, the chromium layer 11 having apertures at corresponding portions to the first and second metal layers 5 and 6 is formed on the surface of the polymer resin layer 8, and etching the polymer resin layer disposed under the apertures by an oxygen plasma. For etching away the polyimide resin layer of 5 $\mu$ in thickness, the plasma etching is carried out for 10 minutes under the plasma whose output is 0.7 KW generated under oxygen having an 0.6 Torr pressure and a flow rate of 3 liters per minute. A time period of the etching is controlled by selecting the flow rate of the oxygen, the pressure of the oxygen, and/or the high frequency of power applied to the oxygen. For etching away the aluminum oxide layer 7, an etching solution consisting of phosphoric acid, nitric acid, glacial acetic acid and water, whose volume % is 70, 10, 10 10 and 10, is contacted to the aluminum oxide layer 7.

Figure 4:
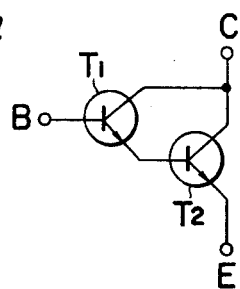
FIG. 4 is a circuit diagram of said another embodiment shown in FIG. 3.

In the above-mentioned embodiment, a polymer resin having a following formula is utilized;

whose diagram is shown in FIG. 4, comprises an n-type Si body 11, a p-type first semiconductor region 12 disposed in said body 11, a p-type second semiconductor region 13 disposed in other part of said body 11 than the part at which said first semiconductor region 12 is disposed, an n-type third semiconductor region 14 disposed in said first semiconductor region 12, an n-type fourth semiconductor region 15 disposed in said second semiconductor region 13, an insulating layer 16 of $Si_3N_4$ disposed on the surface of said Si body 11, a metal oxide layer 17 of titanium oxide disposed on said $Si_3N_4$ layer 16, which has a thickness of about 200 A, a polymer resin layer 18 of polyimide disposed on said titanium oxide layer 17, which has a thickness of about 4 $\mu$, a base electrode 19 penetrating said polyimide layer 18, titanium oxide layer 17 and $Si_3N_4$ layer 16 to contact with the second semiconductor region 13 which acts as a base B of the darlington circuit shown in FIG. 4, a metal layer 20 penetrating said polyimide layer 18, titanium oxide layer 17 and $Si_3N_4$ layer 16 to contact with the fourth semiconductor region 15 which acts as an emitter of a transistor $T_1$ shown in FIG. 4, to contact with the first semiconductor region 12 which acts as a base of a transistor $T_2$ shown in FIG. 4 and to interconnect the third semiconductor region 14 to the fourth semiconductor region 15, an emitter electrode 2, penetrating said polyimide layer 18, titanium oxide layer 17 and $Si_3N_4$ layer 16 to contact with the third semiconductor region 14 which acts as an emitter E of the darlington circuit shown in FIG. 4, a collector electrode 22 penetrating said polyimide layer 18, titanium oxide layer 17 and $Si_3N_4$ layer 16 to contact with the body 11 which acts as a collector C of the darlington circuit shown in FIG. 4.

This semiconductor device is fabricated by preparing the Si body 11 of n-type, diffusing boron into the body 11 for forming the first and second semiconductor regions 12 and 13, diffusing phosphorus into the first and second semiconductor regions 12 and 13 for forming the third and fourth semiconductor regions 14 and 15, forming the $Si_3N_4$ layer 16 on the surface of the body 11, forming the titanium oxide layer 17 having a thickness of about 200 A on the surface of the $Si_3N_4$ layer 16, forming the polyimide layer 18 having a thickness of about 4 $\mu$ on the surface of the titanium oxide layer 17, etching selectively the polyimide layer 18 for exposing the surfaces of the titanium oxide layer 17 corresponding to the surfaces of the first, second, third and fourth semiconductor regions 12, 13, 14 and 15 and of the body 11, etching the exposed portions of the titanium oxide layer 17 for exposing the surfaces of the $Si_3N_4$ layer 16 corresponding to the first, second, third and fourth

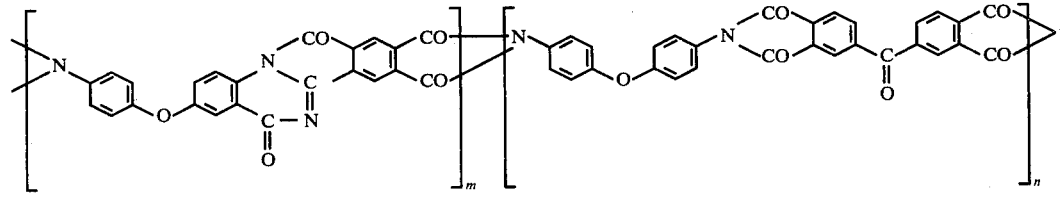

Figure 3:
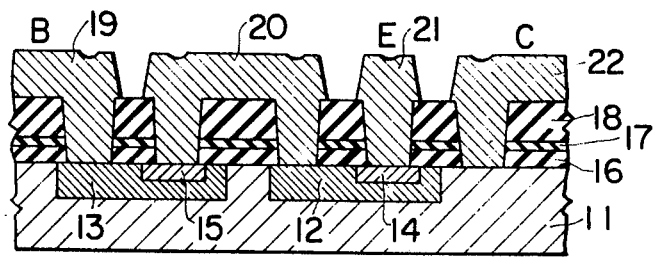
FIG. 3 is a longitudinal sectional view of another embodiment of the present invention.

Shown in FIG. 3 is a section of another embodiment of the present invention, which provides less capacities between electrodes and a semiconductor body than that in the embodiment shown in FIG. 1.

The semiconductor device shown in FIG. 3, which is an integrated circuit device of a darlington circuit semiconductor regions 12, 13, 14 and 15 and of the body 11, etching the exposed portions of the $Si_3N_4$ layer 16 for exposing the surfaces of the first, second, third and fourth semiconductor regions 12, 13, 14 and 15 and of the body 11, and forming metal layers 19, 20, 21 and 22 so as to contact with the second semiconductor region 13, with the fourth and first semiconductor regions 15 and 12, with the third semiconductor region 14, and with the body 11, respectively.

In the above embodiment, the titanium oxide layer 17 is formed by applying titanium acetylacetonate dissolved in alcohol onto the surface of $Si_3N_4$ layer 16, and heating it at a temperature of about 250° C. for 30 minutes. Other methods for forming a titanium oxide layer, such as an electrical discharge method described in, for example, U.S. Pat. No. 3,239,368, and an evaporation method, may be employed in the present invention.

The polyimide layer 18 is formed by applying a solution of uncured polyimide resin in dimethyl acetamide onto the titanium oxide layer 17 and then heating it at a temperature of about 300° C. for 10 minutes. There is a more detailed description as to the method for applying the polyimide layer in U.S. Pat. No. 3,700,497.

The adhesive-strength between the insulating layer disposed on the semiconductor body and the polymer resin layer in the above embodiment is stronger than that of the device wherein there is no metal oxide layer between the insulating layer and the polymer resin layer, but it is very weak when compared with the embodiment shown in FIG. 1 wherein the aluminum oxide is utilized as the metal oxide layer. This effect will be explained later by referring to FIG. 12.

Though, in the embodiment shown in FIG. 1, the aluminum oxide is formed by a reaction between $AlCl_3$, $CO_2$ and $H_2$, other conventional methods, such as a vacuum evaporation method, a thermal decomposition method, an electrical discharge method, etc., may be utilized. In the present invention, it is most preferable to form the aluminum oxide layer by heat-treating aluminum chelate compounds.

Before describing further embodiments of the present invention wherein aluminum oxide layer formed by heat-treating aluminum chelate compounds is utilized as the metal oxide layer between the insulating layer and the polymer resin layer, aluminum chelate compounds which are suitable for the present invention will be described.

The aluminum chelate compounds suitable for the present invention have following general formulae:

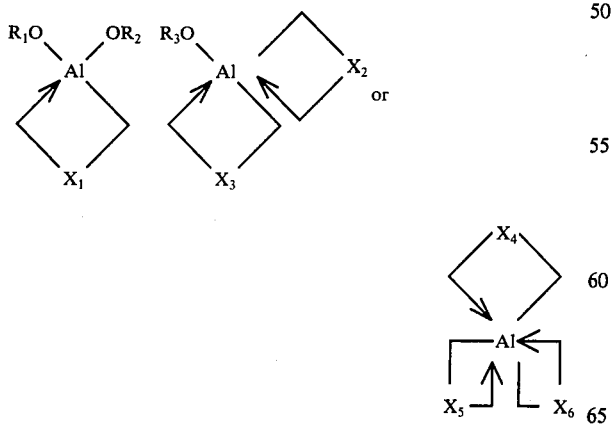

wherein $X_1$ through $X_6$ designate coordinate groups each of which is selected from the group consisting of

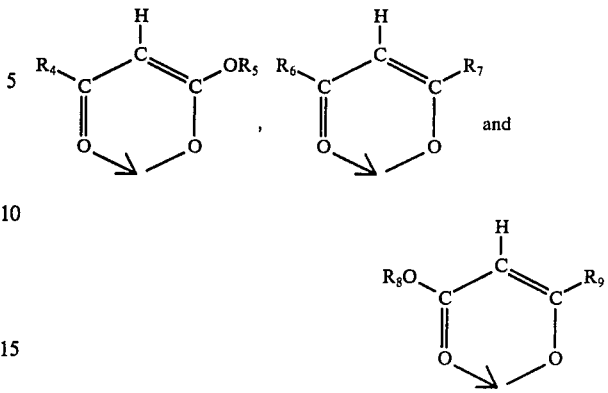

wherein $R_1$ through $R_9$ designate alkyl group having a carbon number of 1 to 4, and the symbols → designate coordinate bonds.

The reason why the carbon number of the alkyl group $R_1$ through $R_9$ should be between 1 and 4 is that, since aluminum chelate compounds including such alkyl groups having the carbon numbers more than 4 have very high melting points, and hence it becomes difficult to be refined by a general refining process, such as a distillation, and to be thermally decomposed completely, electrical characteristics of semiconductor devices are influenced badly, when the aluminum chelate compounds including the alkyl group having the carbon numbers more than 4 are applied to form the aluminum oxide layer between the insulating layer on the semiconductor body and the polymer resin layer.

Among the aluminum chelate compounds including the alkyl group having the carbon numbers between 1 and 4, the following five aluminum chelate compounds are most suitable for the present invention.

1. Aluminum-mono-ethylacetoacetate-diisopropylate

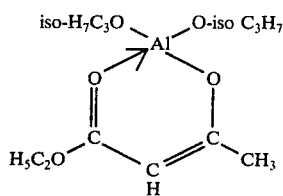

2. Aluminum tris (ethylacetoacetate)

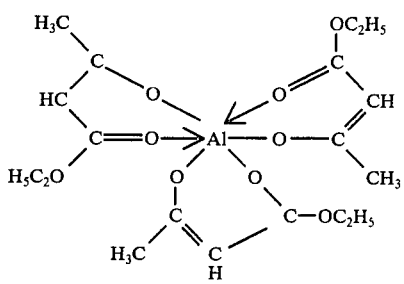

3. Aluminum tris (acetylacetonate)

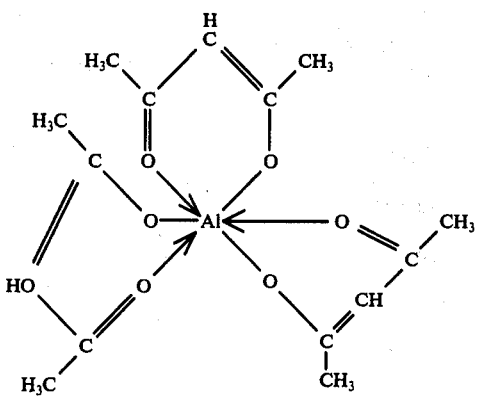

4. Aluminum tris (malonic acid ethylate)

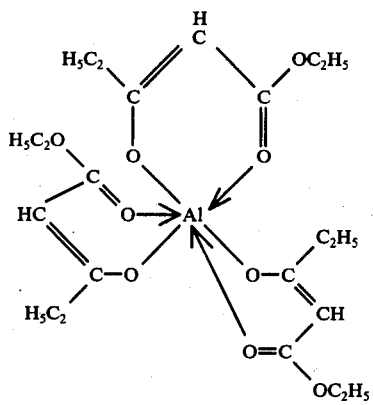

and
5. Aluminum-di-ethylacetoacetate-mono-isopropylate.

In the present invention following aluminum chelate compounds may also be utilized.
Aluminum-mono-acetylacetonate-diisopropylate,
Aluminum-di-acetylacetonate-mono-isopropylate,
Aluminum-mono-methylacetoacetate-diisopropylate,
Aluminum-di-methylacetoacetate-mono-isopropylate,
Aluminum tris (methylacetoacetate),
Aluminum-mono-propylacetoacetate-diisopropylate,
Aluminum-di-propylacetoacetate-mono-isopropylate,
Aluminum tris (propylacetoacetate),
Aluminum-mono-butylacetoacetate-diisopropylate,
Aluminum-di-butylacetoacetate-mono-isopropylate, and
Aluminum tris (butylacetoacetate).

Further, in the present invention, aluminum chelate compounds which include methylate, ethylate, n-propylate, n-butylate, ses-butylate or ter-butylate instead of isopropylate in the above-mentioned aluminum chelate compounds may be utilized for the present invention.

According to the present inventors' experiments, it was very hard to form an aluminum oxide layer by utilizing organic aluminum compounds except aluminum chelate compounds, for example, aluminum alcoholate, such as

| Aluminum-isopropylate | $(i-C_3H_7O)_3Al$ |
| Aluminum-tri-ethylate | $(C_2H_5O)_3Al$ |
| Aluminum-n-butylate | $(n-C_4H_9O)_3Al$ |
| Aluminum-isobutylate | $(i-C_4H_9O)_3Al$ |
| Aluminum-sec-butylate | $(sec-C_4H_9O)_3Al$, and |
| Aluminum-ter-butylate | $(ter-C_4H_9O)_3Al$, | and aluminum fatty acid ester compounds, such as

| Aluminum acetate | $(CH_3COO)_3Al$, |
| Aluminum palmitate | $(C_{15}H_{31}COO)_3Al$, and |
| Aluminum stearate | $(C_{17}H_{35}COO)Al(OH)_2$, | since these compounds become white powders when they are dissolved in a solvent and applied onto the surface of the insulating layer, or it is very difficult to dissolve these compounds in a solvent. It is considered by the inventors that the white powderization of these compounds is because that these compounds hydrolyze very quickly and hence are changed to aluminum hydroxide or alumina quickly by moisture.

Therefore it is impossible to accomplish the present invention by utilizing the above-mentioned organic aluminum compounds, such as aluminum alcoholate and aluminum fatty acid ester compounds.

The aluminum chelate compounds are suitable for accomplishing the present invention, since they are stable against moisture and not changed to white powders, and hence the aluminum oxide film is easily formed.

The method for forming the aluminum oxide layer on the insulating layer by utilizing the aluminum chelate compounds is accomplished by the steps of dissolving the aluminum chelate compounds in a solvent, applying the solution on the surface of the insulating layer, and, immediately or later on, heat-treating the applied solution.

It is suitable for the solvents that toluene, n-hexane, cyclohexane, benzene, xylene, isopropyl alcohol, n-butanol, tri-chloroethylene and carbon tetrachloride be used.

In the present invention, it is preferable to apply the solution on the surface of the insulating layer by rotating the insulating layer for forming the aluminum oxide layer having a uniform thickness.

For accomplishing the present invention, the kind of aluminum chelate compounds, the rotation speed for applying the solution and the concentration of the aluminum chelate compound in the solution should be controlled, since the thickness of the aluminum oxide layer depends upon said kind of aluminum chelate compounds, said rotation speed and said concentration.

For example, when the aluminum chelate compound is the aluminum-mono-ethylacetoacetate-diisopropylate, the rotation speed is 5000 rpm, and the concentrations are 50 wt. %, 10 wt. %, 2 wt. %, 0.3 wt. % and 0.05 wt. %, aluminum oxide layers having a thickness of about 2000 A, 450 A, 220 A, 50 A and 10 A, respectively are obtained, and when the aluminum tris (ethylacetoacetate) is utilized as the aluminum chelate compound, the rotation speed is 5000 rpm, and the concentrations are 50 wt. %, 10 wt. %, 3 wt. % and 1 wt. %, aluminum oxide layers having a thickness of about 760 A, 250 A, 50 A and 10 A, respectively are obtained.

The heat-treatment of the solution is also important for obtaining the aluminum oxide layer. A condition of the heat-treatment is that a temperature should be higher than about 300° C., and a time period should be longer than 10 minutes. When the temperature is lower than 300° C., incomplete aluminum oxide is formed and hence the adhesive-strength becomes not so strong. The temperature, however, should be lower than a temperature at which the metal layers and/or the semiconductor body are damaged. That is, when the metal layer is Al, the temperature should be lower than about 550° C., and when the metal layer has a higher melting point than that of the semiconductor body, for example, when W, Ta, Ti, Cu, Ni, Mo, Cr or Pt, and Si are utilized as the metal layer and as the semiconductor body, the temperature should be determined by Si, that is about 1000° C. When the temperature is higher than that at which one of the metal layers and the semiconductor body is damaged, an yield rate of the semiconductor device becomes low. Further, when the time period is less than 10 minutes, only incomplete aluminum oxide layers are formed and hence the adhesive-strength becomes not so strong.

This heat-treatment can be carried out immediately or later on after the solution is applied, that is, before a polymer resin layer is formed or during the polymer resin layer is formed. The method for forming the polymer resin layer includes a heat-treating step, and sometimes a temperature and a time period satisfy the above-mentioned conditions for forming the aluminum oxide layer. Therefore, when the condition of the heat-treatment for forming the polymer resin layer satisfies the condition for forming the aluminum oxide layer, the heat-treatment for the aluminum oxide layer itself may be omitted. In other words, the aluminum oxide layer is also formed during the heat-treatment for forming the polymer resin layer.

In the present invention, however, it is preferable to carry out the heat-treatment before forming the polymer resin layer, since impurities sometimes within the applied solution which are unwanted for the semiconductor devices can be evaporated from the solution during the heat-treatment.

Figure 5:
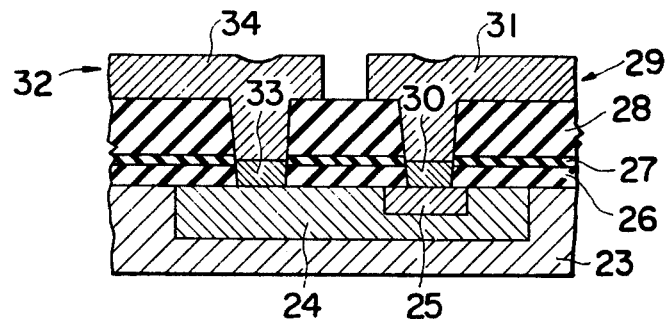
FIG. 5 is a longitudinal sectional view of a further embodiment of the present invention.

FIG. 5 is a sectional view of a further embodiment of the present invention, which comprises an n-type Si body 23 which acts as a collector, a p-type first semiconductor region 24 disposed in said body 23, which acts as a base, an n-type second semiconductor region 25 disposed in said first semiconductor region 24, which acts as an emitter, an insulating layer 26 of $SiO_2$ disposed on the surface of said Si body 23, a metal oxide layer 27 of aluminum oxide disposed on said $SiO_2$ layer 26, which has a thickness of 200 A, a polymer resin layer 28 of PIQ disposed on said aluminum oxide layer 27, which has a thickness of 5 $\mu$, an emitter electrode 29 penetrating said PIQ layer 28, aluminum oxide layer 27 and $SiO_2$ layer 26 in contact with the second semiconductor region 25, which consists of a first metal layer 30 and a third metal layer 31 which extends to a part of the surface of the PIQ layer 28, and a base electrode 32 penetrating said PIQ layer 28, aluminum oxide layer 27 and $SiO_2$ layer 26 in contact with the first semiconductor region 24, which consists of a second metal layer 33 and a fourth metal layer 34 which extends to another part of the surface of the PIQ layer 28 than the part at which the second metal layer 31 is disposed.

Figure 6A:
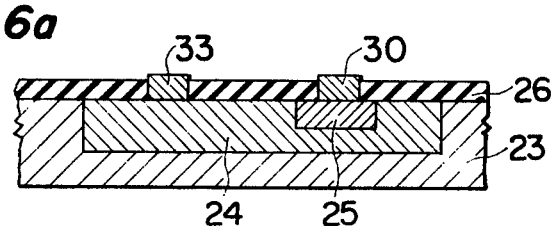
FIGS. 6a through 6c show in longitudinal section, explanatory views of the intermediate products obtained in the process for making the further embodiment shown in FIG. 5.
Figure 6B:
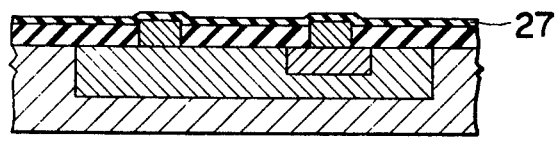
Figure 6C:
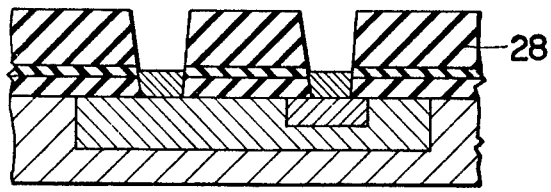

This semiconductor device, that is, a transistor, is fabricated by preparing the Si body 23, diffusing boron into the body 23 for forming the first semiconductor region 24, diffusing phosphorus into the first semiconductor region 24 for forming the second semiconductor region 25, forming the $SiO_2$ layer 26 on the surface of the body 23, forming apertures in the $SiO_2$ layer 26 for exposing the surfaces of a part of the first semiconductor region 24 and of a part of the second semiconductor region 25, forming the first metal layer 30 of Al and the second metal layer 33 of Al in the apertures, (FIG. 6a), forming the aluminum oxide layer 27 having a thickness of 200 A on the surfaces of the $SiO_2$ layer 26 and of the first and second metal layers 30 and 33, (FIG. 6b), forming the PIQ layer 28 having a thickness of 5 $\mu$ on the surface of the aluminum oxide layer 27, etching selectively the PIQ layer 28 for exposing the surfaces of the aluminum oxide layer 27 corresponding to the surfaces of the first and second metal layers 30 and 33, etching the exposed portions of the aluminum oxide layer 27 for exposing the surfaces of the first and second metal layers 30 and 33, (FIG. 6c), and forming the third metal layer 31 and the fourth metal layer 34 so that one part thereof is connected to each of the first and second metal layers 30 and 33 and other part thereof extends on the surface of the PIQ layer 28.

In the above embodiment, the aluminum oxide layer is formed by applying a solution of toluene including aluminum-monoethylacetoacetate-diisopropylate whose concentration is 2 wt. % onto the surfaces of the $SiO_2$ layer 26 and of the first and second metal layers 30 and 33, and heating it at a temperature of about 400° C. for 30 minutes.

This aluminum oxide is etched by an etching solution consisting of phosphoric acid, nitric acid, glacial acetic acid and water, whose volume % is 70, 10, 10 and 10, respectively.

The PIQ layer 28 is formed by applying a solution of prepolymer of PIQ (solvent: N-methyl-2-pyrrolidone), whose nonvolatile concentration is 15 wt. % and viscosity is about 1000 centipoises, and heating it at a temperature of 150° C. for 1 hour and then at a temperature of 300° C. for 1 hour.

Figure 7:
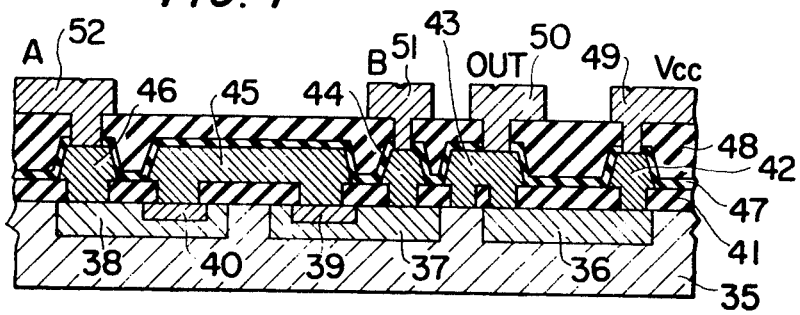
FIG. 7 is a longitudinal sectional view of a still further embodiment of the present invention.
Figure 8:
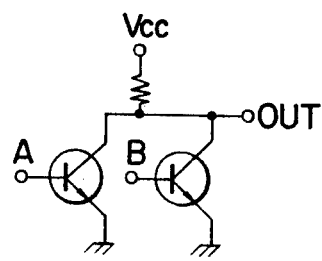
FIG. 8 is a circuit diagram of the still further embodiment shown in FIG. 7.

FIG. 7 is a longitudinal sectional view of a still further embodiment of the present invention, which is an integrated circuit device of a direct coupled transistor logic circuit (DCTL) whose diagram is shown in FIG. 8.

This semiconductor device comprises an n-type Si body 35, a p-type first semiconductor region 36 in said body 35, a p-type second semiconductor region 37 disposed in another part of said body 35 than that at which said first semiconductor region 36 is disposed, a p-type third semiconductor region 38 disposed in another part of said body 35 than those at which said first and second semiconductor regions 36 and 37 are disposed, an n-type fourth semiconductor region 39 disposed in said second semiconductor region 37, an n-type fifth semiconductor region 40 disposed in said third semiconductor region 38, an insulating layer 41 of $SiO_2$ disposed on the surface of said Si body 35, a first metal layer 42 penetrating said $SiO_2$ layer 41 to contact with a part of said first semiconductor region 36, a second metal layer 43 penetrating said $SiO_2$ layer to contact with other part of said first semiconductor region 36 than that at which said first metal layer 42 is contacted, with a part of said body 35, and to interconnect said first semiconductor region 36 with said part of said body 35, a third metal layer 44 penetrating said $SiO_2$ layer 41 to contact with said second semiconductor region 37, a fourth metal layer 45 disposed on said $SiO_2$ layer 41, whose one end penetrates said $SiO_2$ layer 41 to contact with said fourth semiconductor region 39 and the other end penetrates said $SiO_2$ layer 41 to contact with said fifth semiconductor region 40, a fifth metal layer 46 penetrating said $SiO_2$ layer 41 to contact with said third semiconductor region 38, a metal oxide layer 47 of aluminum oxide having a thickness of about 450 A disposed on the surfaces of said SiO$_2$ layer 41 and of said first, second, third, fourth and fifth metal layers 42, 43, 44, 45 and 46, a polymer resin layer 48 of PIQ disposed on said aluminum oxide layer 47, and sixth, seventh eighth and nineth metal layers 49, 50, 51 and 52 penetrating said PIQ layer 48 and said aluminum oxide layer 47 to contact with said first, second, third and fifth metal layers 42, 43, 44 and 46, respectively.

Figure 9A:
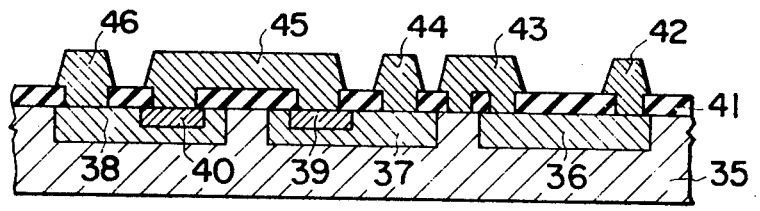
FIGS. 9a through 9c show in longitudinal section, explanatory views of the intermediate products obtained in the process for making the still further embodiment shown in FIG. 7.
Figure 9B:
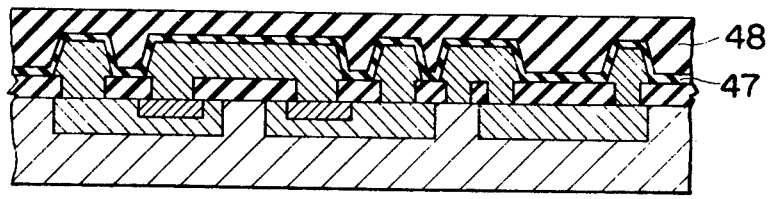
Figure 9C:
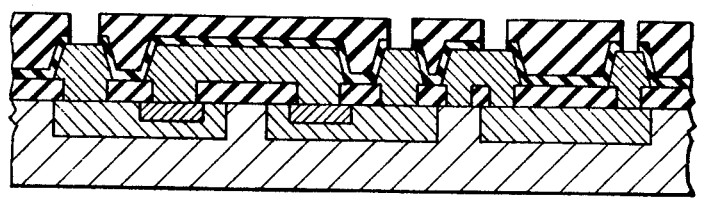

This semiconductor device is fabricated by preparing the Si body 35, selectively diffusing boron into the body 35 for forming the first, second and third semiconductor regions 36, 37 and 38, diffusing phosphorus into the second and third semiconductor regions 37 and 38 for forming the fourth and fifth semiconductor regions 39 and 40, forming the SiO$_2$ layer 41 on the surface of the body 35, forming apertures in the SiO$_2$ layer 41 for exposing the surfaces of parts of the first semiconductor region 36, of a part of the body 35, and of parts of the second, fourth, fifth and third semiconductor regions 37, 39, 40 and 38, forming metal layer on the SiO$_2$ layer 41, etching selectively the metal layer for forming the first, second, third, fourth and fifth metal layers 42, 43, 44, 45 and 46, (FIG. 9a), forming the aluminum oxide layer 47 having a thickness of about 450 A on exposed surfaces of the SiO$_2$ layer 41 and on the surfaces of the first, second, third, fourth and fifth metal layers 42, 43, 44, 45 and 46, forming the PIQ layer 48 on the aluminum oxide layer 47, (FIG. 9b), etching selectively the PIQ layer 48 and the aluminum oxide layer 47 for exposing the surfaces of the first, second, third and fifth metal layers 42, 43, 44 and 46, and forming the sixth, seventh, eighth and ninth metal layers 49, 50, 51 and 52 so that one part thereof is connected to each of the first, second, third and fifth metal layers 42, 43, 44 and 46 and other part thereof extends on the surface of the PIQ layer 48.

In the above embodiment, the aluminum oxide layer is formed by applying a solution of toluene including aluminum-di-ethylacetoacetate-mono-isopropylate whose concentration is 10 wt. % onto the surfaces of the SiO$_2$ layer 41 and of the first, second, third, fourth nd fifth metal layers 42, 43, 44, 45 and 46, and heating it at a temperature of about 350° C. for 30 minutes.

This aluminum oxide is etched by an etching solution consisting of phosphoric acid, nitric acid, glacial acetic acid and water whose volume % is 70, 10, 10 and 10, respectively.

The PIQ layer 48 is formed by applying solution of prepolymer of PIQ (solvent: N-methyl-2-pyrrolidone) whose nonvolatile concentration is 15 wt. % and viscosity is about 1000 centipoises, and heating it at a temperature of 150° C. for 1 hour and then at a temperature of 300° C. for 1 hour.

In the above embodiment, the adhesiveness between the first, second, third, fourth and fifth metal layers 42, 43, 44, 45 and 46 and the PIQ layer 48 is also improved, when compared with that in a semiconductor device wherein no aluminum oxide layer is disposed between a metal layer and a polymer resin layer.

Figure 10:
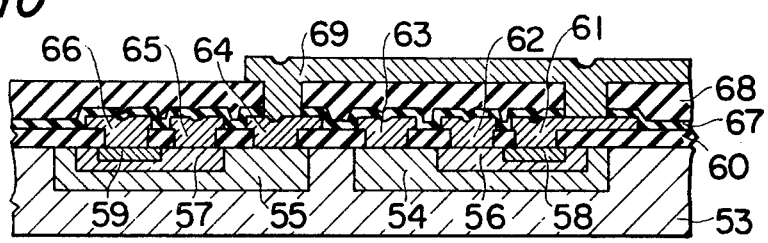
FIG. 10 is a longitudinal sectional view of a still further embodiment of the present invention.

FIG. 10 is a longitudinal sectional view of a still further embodiment of the present invention, which comprises a p-type Si body 53, an n-type first semiconductor region 54 disposed in said body 53, an n-type second semiconductor region 55 disposed in another part of said body 53 than that at which said first semiconductor region 54 is disposed, a p-type third semiconductor region 56 disposed in said first semiconductor region 54, a p-type fourth semiconductor region 57 disposed in said second semiconductor region 55, an n-type fifth semiconductor region 58 disposed in said third semiconductor region 56, an n-type sixth semiconductor region 59 disposed in said fourth semiconductor region 57, an insulating layer 60 of Si$_3$N$_4$ disposed on the surface of the body 53, first, second, third, fourth, fifth and sixth metal layers 61, 62, 63, 64, 65 and 66 penetrating the Si$_3$N$_4$ layer 60 to contact with the fifth, third, first, second, fourth and sixth semiconductor regions 58, 56, 54, 55, 57 and 59, respectively, a metal oxide layer 67 of aluminum oxide having a thickness of about 50 A disposed on the surfaces of the Si$_3$N$_4$ layer 60 and of the first, second, third, fourth, fifth and sixth metal layers 61, 62, 63, 64, 65 and 66, a polymer resin layer 68 of polyimide disposed on the aluminum oxide layer 67, and a seventh metal layer 69 penetrating the polyimide layer 68 and the aluminum oxide layer 67 to contact with the first and fourth layer 61 and 64, interconnecting the first metal layer 61 and the fourth metal layer 64 and extending to a part of the surface of the polyimide layer 68.

In this embodiment, the aluminum oxide layer 67 is completely formed during the formation of the polyimide layer 68. A solution of toluene including aluminum tris (acetylacetonate) whose concentration is 3 wt. % for the aluminum oxide layer 67, is applied onto the surface of the Si$_3$N$_4$ layer 60 and of the first, second, third, fourth, fifth and sixth metal layers 61, 62, 63, 64, 65 and 66. A solution of prepolymer of polyimide whose concentration is 18 wt. % and viscosity is about 1500 centipoises is applied onto the solution for the aluminum oxide which is dried by leaving in a room temperature and/or by heating at a temperature between the room temperature and about 100° C. During the heat-treatment of the prepolymer solution, for obtaining the polyimide layer 68, at a temperature of 150° C. for 1 hour and then 300° C. for 40 minutes, not only the polyimide layer 68 is obtained, but also the aluminum oxide layer 67 is completely formed.

Figure 11:
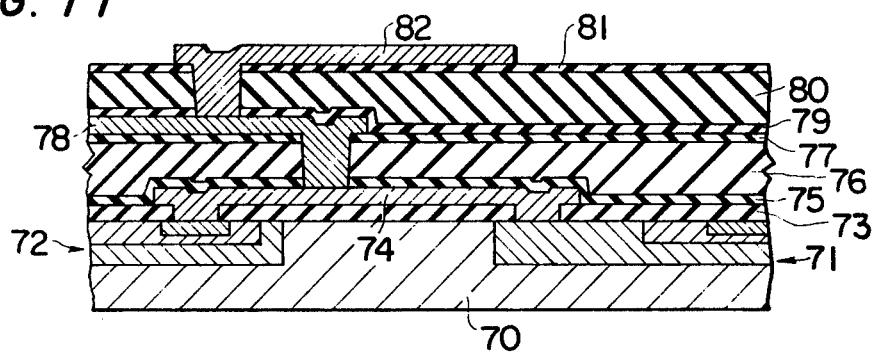
FIG. 11 is a longitudinal sectional view of a still further embodiment of the present invention.

FIG. 11 is a longitudinal sectional view of a still further embodiment of the present invention, which is an integrated circuit semiconductor device having multi-level interconnections.

This semiconductor device comprises a Si body 70 wherein two transistors 71 and 72 isolated to each other are disposed, an insulating layer 73 of SiO$_2$ disposed on the surface of the body 70, a first metal layer 74 penetrating the SiO$_2$ layer 73 to contact with a collector region of the transistor 71 and with an emitter region of the transistor 72 and overlying on a part of the surface of the SiO$_2$ layer 73 to interconnect the collector region of the transistor 71 with the emitter region of the transistor 72, a first metal oxide layer 75 having a thickness of about 50 A of aluminum oxide disposed on the surfaces of the SiO$_2$ layer 73 and of the first metal layer 74, a first polymer resin layer 76 having a thickness of about 3 $\mu$ of PIQ disposed on the first aluminum oxide layer 75, a second metal oxide layer 77 having a thickness of about 50 A of aluminum oxide disposed on the first PIQ layer 76, a second metal layer 78 penetrating the second aluminum oxide layer 77, the first PIQ layer 76 and the first aluminum oxide layer 75 to contact with the first metal layer 74 and extending onto a part of the surface of the second aluminum oxide layer 77, a third metal oxide layer 79 having a thickness of about 50 A of aluminum oxide disposed on the surfaces of the second aluminum oxide layer 77 and of the second metal layer 78, a second polymer resin layer 80 having a thickness of about 3 μ of PIQ disposed on the third aluminum oxide layer 79, a fourth metal oxide layer 81 having a thickness of about 50 A of aluminum oxide disposed on the second PIQ layer 80, and a third metal layer 82 penetrating the fourth aluminum oxide layer 81, the second PIQ layer 80 and the third aluminum oxide layer 79 to contact with the second metal layer 78 and extending on a part of the surface of the fourth aluminum oxide layer 81.

In this embodiment, the aluminum oxide layers are formed by applying a solution of toluene including aluminum tris (ethylacetoacetate) whose concentration is 1 wt. %, and heating it at a temperature of about 400° C. for 20 minutes.

Figure 12:
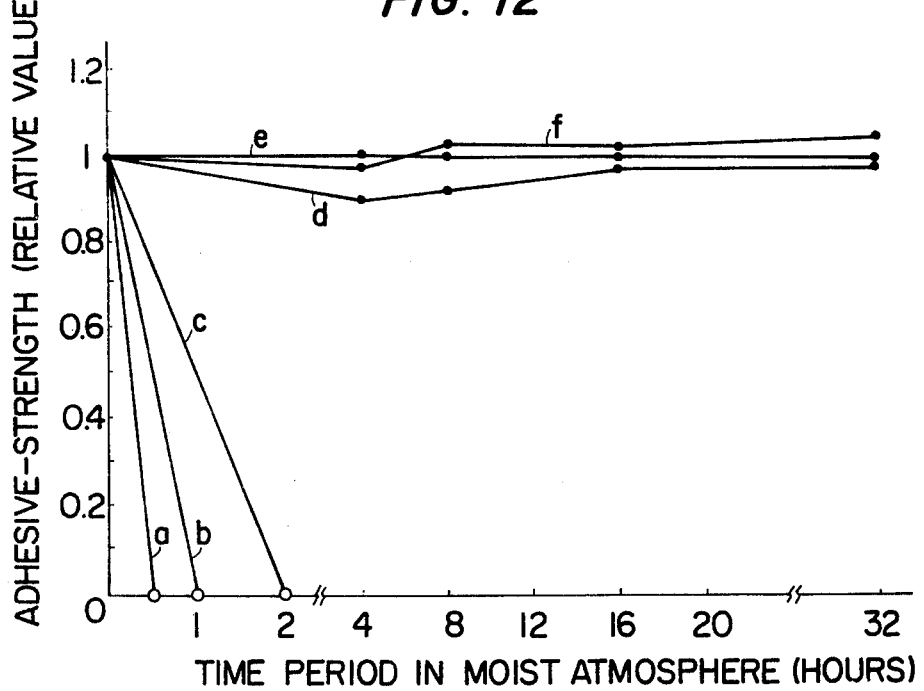
FIG. 12 is a graph showing relationships between adhesive-strength and time period in a moist atmosphere, of conventional semiconductor devices and of semiconductor devices of the present invention.

An advantage of the present invention, especially the adhesive-strength between the insulating layer and the polymer resin layer, is explained by referring to FIG. 12 showing a relationship between the adhesive-strength and a time period in a moist atmosphere of semiconductor devices wherein insulating layers and polymer resin layers are utilized.

In FIG. 12, a vertical axis shows an adhesive-strength wherein the adhesive-strength of an initial stage of the semiconductor device to be examined is denoted as "1", and a horizontal axis shows a time period in a moist atmosphere of an atmospheric pressure of 2 and of 120° C. In this experiments, it is assumed as the adhesive-strength of peeling off the polymer resin layer from the insulating layer by 1 cm in a width.

In FIG. 12, a curve $a$ is obtained by an examination of the semiconductor device wherein the polymer resin layer of PIQ is directly disposed on the insulating layer of $SiO_2$, a curve $b$ is obtained by an examination of a semiconductor device wherein the polymer resin layer of PIQ is coupled with the insulating layer of $SiO_2$ by an amino silane compound, a curve $c$ is for a semiconductor device wherein the polymer resin layer of PIQ is coupled with the insulating layer of $SiO_2$ by a metal oxide layer of titanium oxide, and curves $d$, $e$ and $f$ are for the semiconductor devices wherein the polymer resin layer of PIQ is coupled with the insulating layer of $SiO_2$ by a metal oxide layer of aluminum oxide formed by heat-treating aluminum chelate compounds.

As apparent from FIG. 12, in the semiconductor devices wherein no coupling layer and the aminosilane compound are disposed between the polymer resin layer and the insulating layer, an adhesive-strength becomes zero within 0.5 hour and 1 hour, respectively. While, in the semiconductor devices wherein the metal oxide layer is disposed between the polymer resin layer and the insulating layer, the adhesive-strength is increased. Especially, in the semiconductor device wherein the aluminum oxide is disposed between the polymer resin layer and the insulating layer, the adhesive-strength is remarkably increased.

Though in the embodiment described above, the $SiO_2$ layer and the $Si_3N_4$ layer are utilized as the insulating layer, other insulating materials, such as phosphosilicate glass and borosilicate glass may be utilized instead of $SiO_2$ or $Si_3N_4$.

While the invention has been explained in detail, it is to be understood that the technical scope of the invention is not limited to that of the foregoing embodiments but applicable to all semiconductor devices.

What is claimed is:
1. A semiconductor device comprising:
   a semiconductor body having at least one semiconductor element therein;
   an insulating layer disposed on the surface of said body;
   a first anhydrous aluminum oxide layer having a thickness of between about 10 and about 2000 A and disposed on the surface of said insulating layer; and
   a first polymer resin layer disposed on the surface of said oxide layer.

2. A semiconductor device according to claim 1, wherein the thickness of the first anhydrous aluminum oxide layer is between about 50 and about 2000 A.

3. A semiconductor device according to claim 2, wherein the thickness of the first anhydrous aluminum oxide layer is between about 50 and about 500 A.

4. A semiconductor device according to claim 3, wherein the thickness of the first anhydrous aluminum oxide layer is between about 50 and 200 A.

5. A semiconductor device according to claim 1, wherein the first polymer resin layer is selected from the group consisting of polyimide layer, polybenzimidazole layer and PIQ layer formed by reacting (a) a diaminoamide having the following general formula:

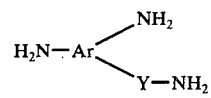

wherein Ar represents a residual radical of an aromatic group, Y represents $SO_2$ or CO, and one of the amino groups and the Y—$NH_2$ group are in an ortho position with respect to each other, (b) a diamine, and (c) a tetracarboxylic acid dianhydride to form a polyaminde-type intermediate product and thereafter causing said intermediate product to dehydrate and to undergo ring closure.

6. A semiconductor device according to claim 2, wherein the first polymer resin layer is selected from the group consisting of polyimide layer, polybenzimidazole layer and PIQ layer formed by reacting (a) a diaminoamide having the following general formula:

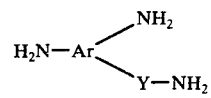

wherein Ar represents a residual radical of an aromatic group, Y represents $SO_2$ or CO, and one of the amino groups and the Y—$NH_2$ group are in an ortho position with respect to each other, (b) a diamine, and (c) a tetracarboxylic acid dianhydride to form a polyamide-type intermediate product and thereafter causing said intermediate product to dehydrate and to undergo ring closure.

7. A semiconductor device according to claim 5, wherein the first polymer resin layer is selected from the group consisting of polyimide layer and PIQ layer formed by reacting (a) a diaminoamide having the following general formula:

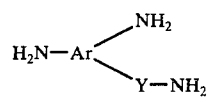

wherein Ar represents a residual radical of an aromatic group, Y represents $SO_2$ or CO, and one of the amino groups and the Y—$NH_2$ group are in an ortho position with respect to each other, (b) a diamine, and (c) a tetracarboxylic acid dianhydride to form a polyamide-type intermediate product and thereafter causing said intermediate product to dehydrate and to undergo ring closure.

8. A semiconductor device according to claim 6, wherein the first polymer resin layer is selected from the group consisting of polyimide layer and PIQ layer formed by reacting (a) a diaminoamide having the following general formula:

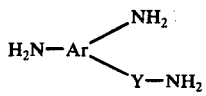

wherein Ar represents a residual radical of an aromatic group, Y represents SO$_2$ or CO, and one of the amino groups and the Y—NH$_2$ group are in an ortho position with respect to each other, (b) a diamine, and (c) a tetracarboxylic acid dianhydride to form a polyamide-type intermediate product and thereafter causing said intermediate product to dehydrate and to undergo ring closure.

9. A semiconductor device according to claim 7, wherein the first polymer resin layer is PIQ layer formed by reacting (a) a diaminoamide having the following general formula:

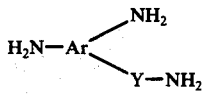

wherein Ar represents a residual radical of an aromatic group, Y represents SO$_2$ and CO, and one of the amino groups and the Y—NH$_2$ group are in an ortho position with respect to each other, (b) a diamine, and (c) a tetracarboxylic acid dianhydride to form a polyamide-type intermediate product and thereafter causing said intermediate product to dehydrate and to undergo ring closure.

10. A semiconductor device according to claim 8, wherein the first polymer resin layer is PIQ layer formed by reacting (a) a diaminoamide having the following general formula:

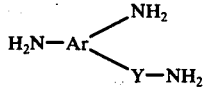

wherein Ar represents a residual radical of an aromatic group, Y represents SO$_2$ or CO, and one of the amino groups and the Y—NH$_2$ group are in an ortho position with respect to each other, (b) a diamine, and (c) a tetracarboxylic acid dianhydride to form a polyamide-type intermediate product and thereafter causing said intermediate product to dehydrate and to undergo ring closure.

11. A semiconductor device according to claim 1, which further comprises a second anhydrous aluminum oxide layer having a thickness of about 10 and about 2000 A disposed on the first polymer resin layer, and a second polymer resin layer, disposed on the second metal oxide layer.

12. A semiconductor device according to claim 11, wherein the first polymer resin layer is selected from the group consisting of polyimide layer and PIQ layer formed by reacting (a) a diaminoamide having the following general formula:

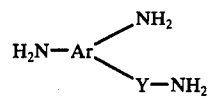

wherein Ar represents a residual radical of an aromatic group, Y represents SO$_2$ or CO, and one of the amino groups and the Y—NH$_2$ group are in an ortho position with respect to each other, (b) a diamine, and (c) a tetracarboxylic acid dianhydride to form a polyamide-type intermediate product and thereafter causing said intermediate product to dehydrate and to undergo ring closure.

13. A semiconductor device according to claim 12, wherein the thickness of each of the first and second anhydrous aluminium oxide layers is between about 50 and about 2000 A.

14. A semiconductor device according to claim 13, wherein the thickness of each of the first and second anhydrous aluminium oxide layers is between about 50 and about 500 A.

15. A semiconductor device according to claim 14, wherein the thickness of each of the first and second anhydrous aluminium oxide layers is between about 50 A and about 200 A.

16. A semiconductor device according to claim 1, which further comprises a first metal layer penetrating the first anhydrous aluminum oxide layer and the first polymer resin layer, and extending on a part of the surface of the first polymer resin layer.

17. A semiconductor device according to claim 16, which further comprises a second anhydrous aluminum oxide layer disposed on the surface of the first polymer resin layer and of the metal layer, a second polymer resin layer disposed on the second anhydrous aluminium oxide layer, and a second metal layer penetrating the second polymer resin layer and the second anhydrous aluminum oxide layer and extending on a part of the surface of the second polymer resin layer.

18. The semiconductor device of claim 1, wherein said first anhydrous aluminum oxide layer is a layer derived from the thermal decomposition of an aluminum chelate compound.

19. The semiconductor device of claim 18, wherein the aluminum chelate compound is selected from the group consisting of aluminum chelate compounds having general formulae of

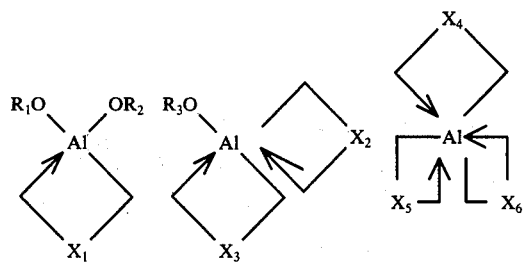

wherein X$_1$ through X$_6$ designate coordinate elements, each of which is

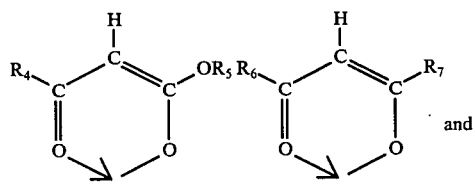

and

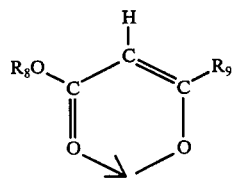

$R_1$ through $R_9$ designate alkyl group having a carbon number of 1 to 4.

20. The semiconductor device of claim 19, wherein the aluminum chelate compound is selected from the group consisting of aluminum-mono-ethylacetoacetate-diisopropylate, aluminum tris (ethylacetoacetate), aluminum tris (acetylacetonate), aluminum tris (malonic acid ethylate), and aluminum-di-ethylacetoacetate-monoisopropylate.

21. The semiconductor device of claim 20, wherein the aluminum chelate compound is selected from the group consisting of aluminum-mono-ethylacetoacetate-diisopropylate, aluminum tris (ethylacetoacetate), and aluminum tris (acetylacetonate).

22. The semiconductor device of claim 19, wherein said first polymer resin layer is a PIQ layer formed by reacting (a) a diamonoamide having the following general formula:

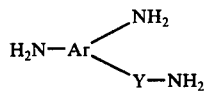

wherein Ar represents a residual radical of an aromatic group, Y represents $SO_2$ or CO, and one of the amino groups and the Y — $NH_2$ group are in an ortho position with respect to each other, (b) a diamine, and (c) a tetracarboxylic acid dianhydride to form a polyamide-type intermediate product and thereafter causing said intermediate product to dehydrate and to underto ring closure.

23. The semiconductor device of claim 18, wherein said first polymer resin layer is a PIQ layer formed by reacting (a) a diamonoamide having the following general formula:

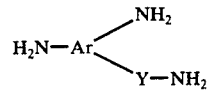

wherein Ar represents a residual radical of an aromatic group, Y represents $SO_2$ or CO, and one of the amino groups and the Y — $NH_2$ group are in an ortho position with respect to each other, (b) a diamine, and (c) a tetracarboxylic acid dianhydride to form a polyamide-type intermediate product and thereafter causing said intermediate product to dehydrate and to undergo ring closure.

24. The semiconductor device of claim 23, wherein said insulating layer is formed from silicon dioxide or silicon nitride.

25. The semiconductor device of claim 1, wherein said insulating layer is formed from silicon dioxide or silicon nitride.

26. The semiconductor device of claim 25, wherein said first anhydrous aluminum oxide layer is derived from the thermal decomposition of an aluminum chelate compound.

27. The semiconductor device of claim 26, wherein the aluminum chelate compound is selected from the group consisting of aluminum chelate compounds having general formulae of

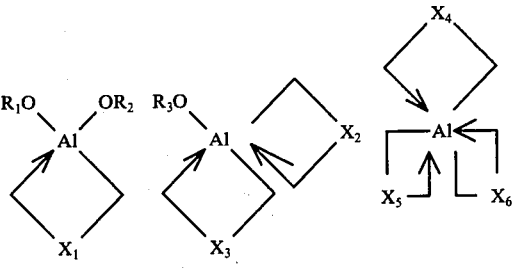

wherein $X_1$ through $X_6$ designate coordinate elements, each of which is

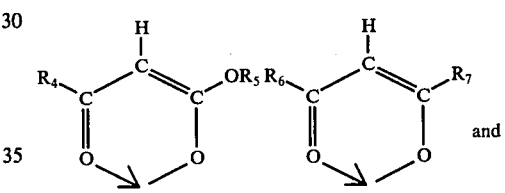

and

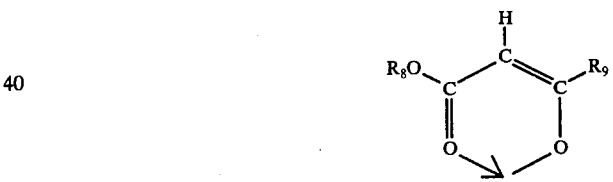

$R_1$ through $R_9$ designate alkyl group having a carbon number of 1 to 4.

28. The semiconductor device of claim 26, wherein said aluminum chelate compound is selected from the group consisting of
Aluminum-mono-acetylacetonate-dialkylate,
Aluminum-di-acetylacetonate-mono-alkylate,
Aluminum-mono-methylacetoacetate-mono-alkylate,
Aluminum-di-methylacetoacetate-mono-alkylate,
Aluminum tris (methylacetoacetate),
Aluminum-mono-propylacetoacetate-dialkylate,
Aluminum-di-propylacetoacetate-mono-alkylate,
Aluminum tris (propylacetoacetate),
Aluminum-mono-butylacetoacetate-dialkylate,
Aluminum-di-butylacetoacetate-mono-alkylate, and
Aluminum tris (butylacetoacetate),
wherein the alkylate moieties are independently selected from the group consisting of methylate, ethylate, n-propylate, isopropylate, n-butylate, sec-butylate and tert-butylate.

29. The semiconductor device of claim 26, wherein said first anhydrous aluminum oxide layer is derived from the reaction of $AlCl_3$, $CO_2$ and $H_2$.

30. The semiconductor device of claim 1, wherein said first anhydrous aluminum oxide layer is derived from the thermal decomposition of an aluminum chelate compound.

31. The semiconductor device of claim 30, wherein the aluminum chelate compound is selected from the group consisting of aluminum chelate compounds having general formulae of

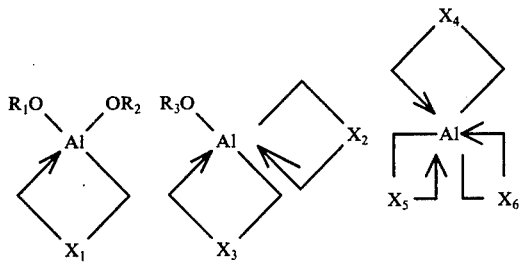

wherein $X_1$ through $X_6$ designate coordinate elements, each of which is

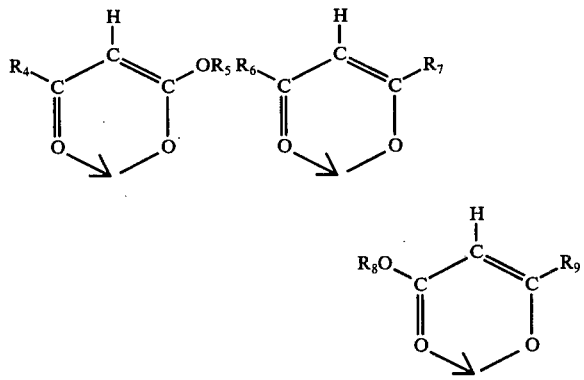

$R_1$ through $R_9$ designate alkyl group having a carbon number of 1 to 4.

32. The semiconductor device of claim 30, wherein said aluminum chelate compound is selected from the group consisting of
Aluminum-mono-acetylacetonate-dialkylate
Aluminum-di-acetylacetonate-mono-alkylate
Aluminum-mono-methylacetoacetate-mono-alkylate
Aluminum-di-methylacetoacetate-mono-alkylate
Aluminum tris (methylacetoacetate),
Aluminum-mono-propylacetoacetate-dialkylate
Aluminum-di-propylacetoacetate-mono-alkylate
Aluminum tris (propylacetoacetate)
Aluminum-mono-butylacetoacetate-dialkylate
Aluminum-di-butylacetoacetate-mono-alkylate, and
Aluminum tris (butylacetoacetate),
wherein the alkylate moieties are independently selected from the group consisting of methylate, ethylate, n-propylate, isopropylate, n-butylate, sec-butylate and tert-butylate.

33. The semiconductor device of claim 30, wherein said first anhydrous aluminum oxide layer is derived from the reaction of $AlCl_3$, $CO_2$ and $H_2$.

34. A semiconductor device comprising:
a semiconductor body having at least one semiconductor element therein;
a anhydrous aluminum oxide layer having a thickness of between about 10 and about 200 A and disposed on the surface of said body; and
a polymer resin layer disposed on the surface of said anhydrous aluminum oxide layer.

35. A semiconductor device according to claim 34, wherein the thickness of the anhydrous alumium oxide layer is between about 50 and about 2000 A.

36. A semiconductor device according to claim 35, wherein the thickness of the anhydrous oxide layer is between about 50 and about 500 A.

37. A semiconductor device according to claim 36, wherein the thickness of the anhydrous aluminum oxide layer is between about 50 and 200 A.

38. A semiconductor device according to claim 34, wherein the first polymer resin layer is selected from the group consisting of polyimide layer and PIQ layer formed by reacting (a) a diaminoamide having the following general formula:

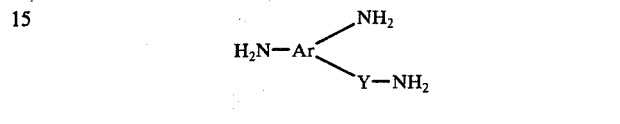

wherein Ar represents a residual radical of an aromatic group, Y represents $SO_2$ or CO, and one of the amino groups and the Y — $NH_2$ group are in an ortho position with respect to each other, (b) a diamine, and (c) a tetracarboxylic acid dianhydride to form a polyamide-type intermediate product and thereafter causing said intermediate product to dehydrate and to undergo ring closure.

39. A semiconductor device according to claim 38, wherein the first polymer resin layer is PIQ layer formed by reacting (a) a diaminoamide having the following general formula:

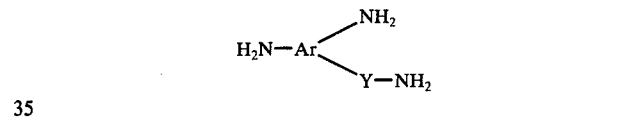

wherein Ar represents a residual radical of an aromatic group, Y represents $SO_2$ or CO, and one of the amino groups and the Y — $NH_2$ group are in an ortho position with respect to each other, (b) a diamine, and (c) a tetracarboxylic acid dianhydride to form a polyamide-type intermediate product and thereafter causing said intermediate product to dehydrate and to undergo ring closure.

40. A semiconductor device according to claim 39, wherein the thickness of the anhydrous aluminum oxide layer is between about 50 and 500 A.

41. A semiconductor device according to claim 40, wherein the thickness of the anhydrous aluminum oxide layer is between about 50 and 200 A.

42. In a semiconductor device including a semiconductor body having at least one semiconductor element therein and an insulating layer disposed on the surface of the semiconductor body, said insulating layer formed from a first layer composed of silicon dioxide or silicon nitride and a second layer formed from a polymer resin, said first layer and said second layer being bonded together by means of an adhesion promoting agent, the improvement wherein said adhesion promoting agent is a anhydrous aluminum oxide.

43. The semiconductor device of claim 42, wherein anhydrous said aluminum oxide is derived from the decomposition of an aluminum chelate.

44. In a semiconductor device including a semiconductor body having at least one semiconductor element therein and an insulating layer formed from a polymer resin layer and a layer of an adhesion promoting agent bonded to said polymer resin layer, the improvement wherein said adhesion promoting agent is an anhydrous aluminum oxide.

* * * * *